(12) United States Patent
Suzuki et al.

(10) Patent No.: US 7,345,184 B2
(45) Date of Patent: Mar. 18, 2008

(54) METHOD AND SYSTEM FOR REFURBISHING A METAL CARBONYL PRECURSOR

(75) Inventors: Kenji Suzuki, Guilderland, NY (US); Gerrit J. Leusink, Saltpoint, NY (US); Fenton R. McFeely, Ossining, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 506 days.

(21) Appl. No.: 11/095,448

(22) Filed: Mar. 31, 2005

(65) Prior Publication Data

US 2006/0224008 A1 Oct. 5, 2006

(51) Int. Cl.
*C07F 15/00* (2006.01)
*C07F 13/00* (2006.01)
*C07F 11/00* (2006.01)
(52) U.S. Cl. .................. 556/136; 556/46; 556/58
(58) Field of Classification Search ............... 556/46, 556/58, 136
See application file for complete search history.

(56) References Cited

U.S. PATENT DOCUMENTS

| | | | |
|---|---|---|---|
| 5,108,983 A | 4/1992 | Lackey, Jr. et al. | 505/1 |
| 5,312,509 A | 5/1994 | Eschbach | 156/345 |
| 5,553,395 A | 9/1996 | Wen et al. | 34/359 |
| 5,766,683 A | 6/1998 | Waibel | |
| 5,904,771 A | 5/1999 | Tasaki et al. | 117/105 |
| 5,914,001 A | 6/1999 | Hansen | 156/345 |
| 6,048,578 A | 4/2000 | Milinkovic et al. | |
| 6,303,809 B1 | 10/2001 | Chi et al. | 556/136 |
| 6,319,832 B1 | 11/2001 | Uhlenbrock et al. | 438/681 |
| 6,428,623 B2 | 8/2002 | Westmoreland et al. | 118/715 |
| 6,440,495 B1 | 8/2002 | Wade et al. | 427/250 |
| 6,544,345 B1 | 4/2003 | Mayer et al. | 134/28 |
| 6,605,735 B2 | 8/2003 | Kawano et al. | 556/136 |
| 6,660,328 B1 | 12/2003 | Dahmen et al. | 427/248.1 |
| 6,701,066 B2 | 3/2004 | Sandhu | 392/386 |
| 6,713,373 B1 | 3/2004 | Omstead | 438/608 |
| 6,718,126 B2 | 4/2004 | Lei | 392/388 |
| 6,740,586 B1 | 5/2004 | Wang et al. | 438/680 |
| 2003/0045736 A1 | 3/2003 | Saito | |
| 2003/0129306 A1 | 7/2003 | Wade et al. | 427/255.28 |
| 2004/0013577 A1 | 1/2004 | Ganguli et al. | 422/129 |
| 2004/0105934 A1 | 6/2004 | Chang et al. | 427/255.28 |
| 2004/0241321 A1 | 12/2004 | Ganguli et al. | 427/255.28 |
| 2005/0081882 A1 | 4/2005 | Greer et al. | 134/1.1 |
| 2005/0110142 A1 | 5/2005 | Lane et al. | 257/751 |
| 2005/0186341 A1 | 8/2005 | Hendrix et al. | 427/248.1 |
| 2006/0220248 A1* | 10/2006 | Suzki | 257/751 |
| 2007/0032079 A1* | 2/2007 | Suzki et al. | 438/681 |
| 2007/0072401 A1* | 3/2007 | Suzki | 438/584 |
| 2007/0215048 A1* | 9/2007 | Suzki et al. | 118/725 |
| 2007/0218200 A1* | 9/2007 | Suzki et al. | 427/248.1 |
| 2007/0231241 A1* | 10/2007 | Suzki | 423/417 |
| 2007/0231489 A1* | 10/2007 | Suzki et al. | 427/255.28 |
| 2007/0232040 A1* | 10/2007 | Suzki et al. | 438/584 |
| 2007/0234955 A1* | 10/2007 | Suzki et al. | 118/715 |
| 2007/0234962 A1* | 10/2007 | Suzki et al. | 118/726 |

FOREIGN PATENT DOCUMENTS

| | | |
|---|---|---|
| CA | 2206217 A1 | 11/1998 |
| CA | 2307036 A1 | 5/2000 |
| EP | 0620291 A1 | 10/1994 |
| EP | 0 714 999 A1 | 6/1996 |
| WO | WO0026432 A1 | 5/2000 |
| WO | WO 2004/010463 A2 | 1/2004 |
| WO | WO2005034223 A1 | 4/2005 |

OTHER PUBLICATIONS

European Patent Office, International Search Report and Written Opinion, dated Aug. 2, 2006, 9 pp.
European Patent Office, International Search Report and Written Opinion of corresponding PCT Application No. PCT/US2006/007675, dated Oct. 13, 2006, 9 pages.

* cited by examiner

*Primary Examiner*—Porfirio Nazario-Gonzalez
(74) *Attorney, Agent, or Firm*—Wood, Herron & Evans, LLP

(57) ABSTRACT

A method and system for refurbishing a metal carbonyl precursor. The method includes providing a metal precursor vaporization system containing a metal carbonyl precursor containing un-reacted and partially reacted metal carbonyl precursor, flowing a CO-containing gas through the metal precursor vaporization system to a precursor collection system in fluid communication with the metal precursor vaporization system to transfer the un-reacted metal carbonyl precursor vapor to the precursor collection system, and collecting the transferred metal carbonyl precursor in the precursor collection system. A method is provided for monitoring at least one metal carbonyl precursor parameter to determine a status of the metal carbonyl precursor and the need for refurbishing the metal carbonyl precursor.

11 Claims, 5 Drawing Sheets

METHOD AND SYSTEM FOR REFURBISHING A METAL CARBONYL PRECURSOR

CROSS REFERENCE TO RELATED APPLICATIONS

The present invention is related to U.S. patent application Ser. No. 10/996,145, entitled "METHOD FOR INCREASING DEPOSITION RATES OF METAL LAYERS FROM METAL-CARBONYL PRECURSORS," and U.S. patent application Ser. No. 10/966,144, entitled "METHOD AND DEPOSITION SYSTEM FOR INCREASING DEPOSITION RATES OF METAL LAYERS FROM METAL-CARBONYL PRECURSORS," each filed Nov. 23, 2004 and the entire contents of which are herein incorporated by reference.

FIELD OF THE INVENTION

The present invention relates to materials processing, and more particularly, to a method and a system for refurbishing a metal carbonyl precursor used for deposition of a metal or metal-containing layer on a substrate.

BACKGROUND OF THE INVENTION

Manufacturing of integrated circuits includes deposition of various materials onto patterned substrates such as silicon wafers. These materials include metal and metal-containing layers, for example diffusion barriers/liners to prevent diffusion of copper (Cu) conducting layers into dielectric materials and seed layers to promote adhesion and growth of the Cu layers onto the substrate. As the minimum feature sizes of patterned substrates continue to shrink, deposition processes are required that can provide advanced layers onto high-aspect ratio structures at sufficiently low temperatures.

Chemical vapor deposition (CVD) has seen increasing use for preparation of coatings and thin layers in semiconductor wafer processing. CVD is a favored deposition method in many respects, for example, because of its ability to provide highly conformal and high quality layers at relatively fast processing times. Further, CVD is beneficial in depositing layers on substrates of irregular shapes including the provision of highly conformal layers even with respect to deep contacts and other openings. In general, CVD techniques involve the delivery of gaseous precursors (reactants) to the surface of a substrate where chemical reactions take place under temperature and pressure conditions that are favorable to the thermodynamics of the desired reaction. The type and composition of layers that can be formed using CVD can be affected by the ability to deliver the reactants or reactant precursors to the surface of the substrate.

In order for the device manufacturing process to be practical, the deposition processes need to be carried out in a reasonable amount of time. This requirement can necessitate efficient delivery of a precursor containing a metal element from a metal precursor vaporization system to a process chamber containing the substrate(s) to be processed. A common problem encountered in the deposition of metals and metal-containing materials by CVD techniques are low deposition rates onto a substrate due to low vapor pressure of the metal-containing precursor and the transport issues associated therewith, thereby making the deposition process impractical. A low vapor pressure can limit the flow of the metal-containing precursor from the metal precursor vaporization system through gas lines to a process chamber of a deposition system where a substrate is exposed to the metal-containing precursor.

The delivery of metal-containing precursors in CVD processing can be carried out using the sublimator/bubbler method where the precursor is usually placed in a metal precursor vaporization system which is then heated to transform the precursor into a gaseous compound (vapor) which is then transported into the process chamber, often using a carrier gas. However, this procedure has not been able to reliably and reproducibly deliver the precursor to the process chamber for a number of reasons. The major problems with the technique are centered on the inability to consistently vaporize a solid precursor at a controlled rate such that a reproducible flow of precursor vapor can be delivered to the process chamber. Also it is difficult to ensure complete saturation of the fast moving carrier gas stream because of the limited amount of exposed surface area of the solid precursor in the metal precursor vaporization system and a lack of uniform temperature to provide maximum sublimation/evaporation. In addition, the temperature to which the solid precursor can be heated to provide adequate vapor pressure can be limited by premature decomposition of the precursor at that temperature. Decomposition or partial reaction of the solid precursor in the metal precursor vaporization system can further complicate the precursor delivery due to low or negligible vapor pressure of the partially reacted precursor compared to the un-reacted (fresh) precursor. In addition, a partially reacted precursor can increase the number of detrimental precursor particles that are transferred to the process chamber and can accumulate on the substrate.

Thus, the presence of partially reacted precursor and un-reacted precursor can prevent reproducible flow of precursor vapor to the process chamber and therefore require refurbishing of the precursor. The refurbishing can include separating the un-reacted precursor from the partially reacted precursor, followed by further use of the un-reacted precursor in the deposition system and recycling of the partially reacted precursor to form a fresh batch of precursor. Current separation methods can involve dissolving the un-reacted precursor using a liquid solvent (e.g., acetone, toluene, etc) and filtering the un-dissolved partially reacted precursor from the solvent. This method commonly require long process times and large amounts of the solvent due to low solubility of the un-reacted precursor in the solvent.

SUMMARY OF THE INVENTION

The present invention provides a method and system for refurbishing a metal carbonyl precursor used for depositing a metal or metal-containing layer on a substrate. Embodiments of the invention allow for separating un-reacted metal carbonyl precursor from partially reacted metal carbonyl precursor. According to an embodiment of the invention, a carbon monoxide (CO) gas is flowed through the metal carbonyl precursor to separate and transfer the un-reacted metal carbonyl precursor from the partially reacted metal carbonyl precursor. The CO gas allows for increasing the sublimation/evaporation temperature by reducing premature thermal decomposition of the metal carbonyl precursor, thereby permitting efficient separation of the un-reacted metal carbonyl precursor from the partially reacted metal carbonyl precursor.

Thus, where a metal precursor vaporization system contains a metal carbonyl precursor containing un-reacted metal carbonyl precursor in combination with an undesired level of partially reacted metal carbonyl precursor, the method includes flowing CO-containing gas through the metal precursor vaporization system to a precursor collection system in fluid communication with the metal precursor vaporization system to transfer the un-reacted metal carbonyl precursor to the precursor collection system, and collecting the transferred metal carbonyl precursor in the precursor collection system.

According to an embodiment of the invention, a method is provided for monitoring status of a metal carbonyl precursor in a metal precursor vaporization system during processing of one or more substrates to determine when partially reacted metal carbonyl precursor has reached an undesired level in the metal precursor vaporization system relative to un-reacted metal carbonyl precursor. The method includes monitoring at least one metal carbonyl precursor parameter, determining the status of the metal carbonyl precursor from the monitoring, and when the determining indicates that the undesired level is reached, stopping the processing and refurbishing the metal carbonyl precursor.

Embodiments of the invention can include various metal carbonyl precursors with the general formula $M_x(CO)_y$. The metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, and $Os_3(CO)_{12}$.

According to an embodiment of the invention, a precursor refurbishing system is provided that includes a metal precursor vaporization system configured to vaporize an un-reacted metal carbonyl precursor, a precursor collection system in fluid communication with the metal precursor vaporization system, a gas source configured for flowing a CO-containing gas through the metal precursor vaporization system to the precursor collection system, a pumping system configured for evacuating the metal precursor vaporization system and the precursor collection system, a temperature control system configured for maintaining the precursor collection system at a temperature lower than the metal precursor vaporization system, and a controller configured for controlling the refurbishing system during transfer of the un-reacted metal carbonyl precursor to the precursor collection system.

DETAILED DESCRIPTION OF SEVERAL EMBODIMENTS

Figure 1A:
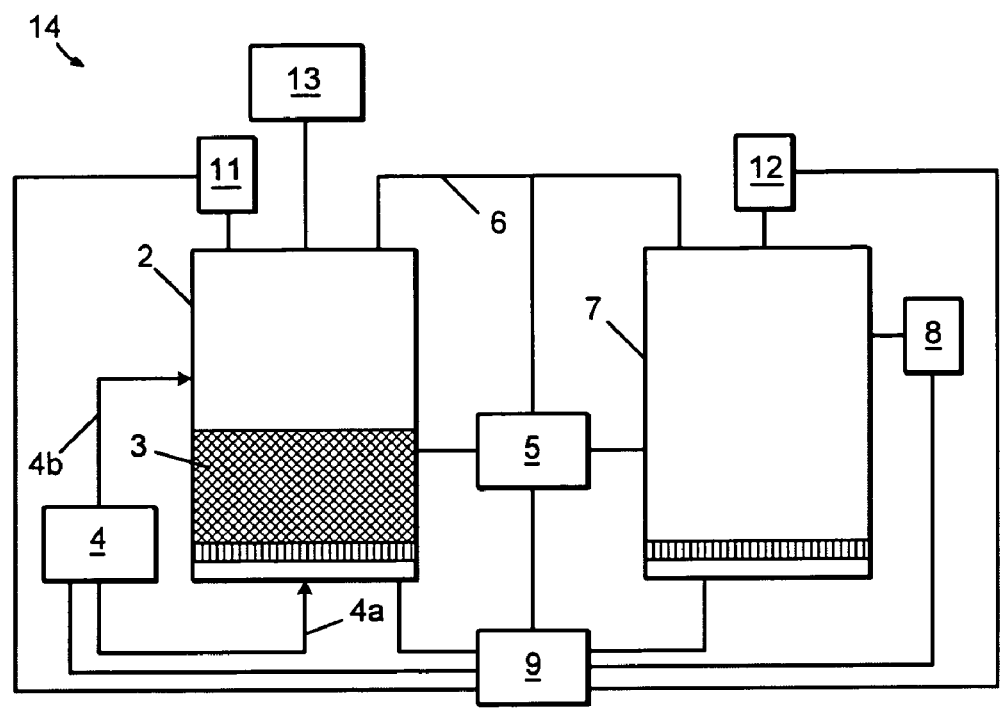
FIGS. 1A-1C each depict a schematic view of a system for refurbishing a metal carbonyl precursor according to an embodiment of the invention.

Embodiments of the current invention provide a method and system for refurbishing a metal carbonyl precursor that may be used for depositing a metal or metal-containing layer on a substrate in a deposition system. Exemplary deposition systems can, for example, be any of the process chambers and metal precursor vaporization systems described in co-pending U.S. patent application Ser. No. 10/996,145, entitled "METHOD FOR INCREASING DEPOSITION RATES OF METAL LAYERS FROM METAL-CARBONYL PRECURSORS," and U.S. patent application Ser. No. 10/996,144, entitled "METHOD AND DEPOSITION SYSTEM FOR INCREASING DEPOSITION RATES OF METAL LAYERS FROM METAL-CARBONYL PRECURSORS," each filed Nov. 23, 2004 and the entire contents of which are herein incorporated by reference.

According to embodiments of the invention, the metal carbonyl precursor can, for example, have the general formula $M_x(CO)_y$ (where M is a metal, CO is carbon monoxide, and x and y are integers). The metal carbonyl precursor can include a tungsten carbonyl, a molybdenum carbonyl, a cobalt carbonyl, a rhodium carbonyl, a rhenium carbonyl, a chromium carbonyl, or an osmium carbonyl, or a combination of two or more thereof. These metal carbonyls can include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof. Below, embodiments of the invention describe the use of a solid metal carbonyl precursor, however, those skilled in the art will appreciate that metal carbonyl precursors that are liquids under the selected heating conditions can be used without departing from the scope of the invention.

The inventors have realized that partial decomposition of a metal carbonyl precursor in a heated metal precursor vaporization system can contribute to the inability to provide a reproducible flow of un-reacted metal carbonyl precursor vapor to a process chamber for depositing a metal or metal-containing layer on a substrate. A fresh metal carbonyl precursor can, over time, partially decompose in the heated metal precursor vaporization system, thereby forming a partially decomposed precursor (e.g., $M_x(CO)_{y-z}$, where $z \geq 1$). Since the un-reacted precursor and partially decomposed precursor can have different vapor pressures, the precursor vapor cannot be reliably and reproducibly sublimated/evaporated in the metal precursor vaporization system and delivered to the process chamber. In addition, metal-containing precursors can contain expensive precious metals, thus requiring that the partially reacted precursor be separated from the un-reacted precursor and recycled for producing a fresh precursor batch.

Embodiments of the invention provide a method and system for separating un-reacted metal carbonyl precursor from partially reacted metal carbonyl precursor in a metal precursor vaporization system without the use of liquid solvents. According to an embodiment of the invention, a CO-containing gas is flowed through the metal carbonyl precursor to transfer and separate the un-reacted metal carbonyl precursor from the partially reacted metal carbonyl precursor. The use of the CO-containing gas allows for increasing the sublimation/evaporation temperature by reducing premature thermal decomposition of the metal carbonyl precursor, thereby permitting efficient separation and transfer of the un-reacted metal carbonyl precursor from a metal precursor vaporization system to a precursor collection system where the un-reacted metal carbonyl precursor is collected. The collected un-reacted metal carbonyl precursor can then be utilized for depositing a layer on a substrate in the process chamber and the partially reacted metal carbonyl precursor remaining in the metal precursor vaporization system may be recycled to form a fresh precursor batch.

In the following description, in order to facilitate a thorough understanding of the invention and for purposes of explanation and not limitation, specific details are set forth, such as a particular geometry of the metal precursor vaporization system and descriptions of various components. However, it should be understood that the invention may be practiced in other embodiments that depart from these specific details.

Figure 1B:
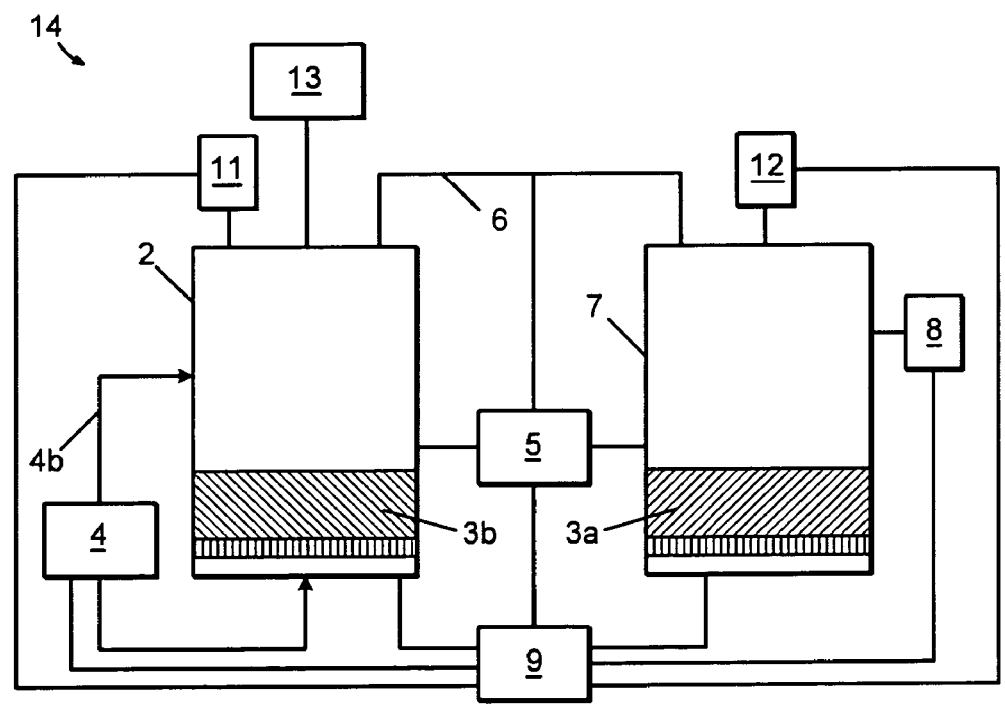
Figure 1C:
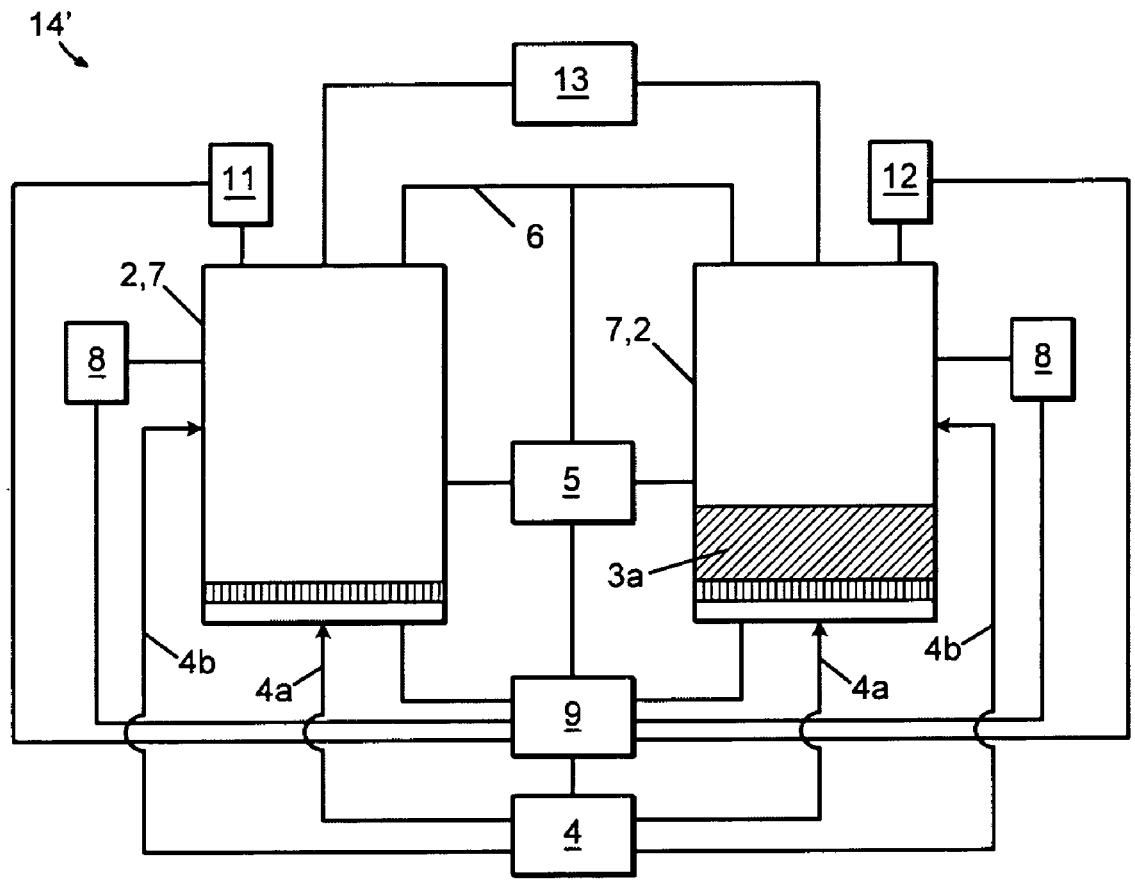

Referring now to the drawings, where like reference numerals are used to refer to like parts, FIGS. 1A-1C each depict a schematic view of a system for refurbishing a metal carbonyl precursor according to embodiments of the invention. In FIG. 1A, the refurbishing system 14 contains a metal precursor vaporization system 2 loaded with a metal carbonyl precursor 3. The metal precursor vaporization system 2 is coupled to a process chamber 13 configured for depositing a metal or metal-containing layer on a substrate, but this is not required for the invention. In general, the metal precursor vaporization system 2 can be any container capable of evaporating/subliming the metal carbonyl precursor 3.

Embodiments of the invention are now described for a solid ruthenium carbonyl precursor $Ru_3CO_{12}$. However, as those skilled in the art will appreciate, embodiments of the invention are not limited to the use of $Ru_3CO_{12}$, as other ruthenium carbonyl and metal carbonyl precursors may be used. The metal precursor vaporization system 2 and the process chamber 13 can, for example, be any of the metal precursor vaporization systems and process chambers described in the above-mentioned co-pending U.S. patent application Ser. Nos. 10/996,145 and 10/996,144.

In order to achieve the desired temperature for subliming/evaporating the ruthenium carbonyl precursor 3, the metal precursor vaporization system 2 is coupled to an vaporization temperature control system 5 configured to control the vaporization temperature. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. The vaporization temperature can, for example, be between about 40° C. and about 150° C. for $Ru_3CO_{12}$, and can be about 80° C. Prolonged use and heating of the $Ru_3CO_{12}$ precursor during processing in the process chamber 13 (e.g., deposition of Ru on a substrate surface) can lead to partial decomposition of the $Ru_3CO_{12}$ precursor in the metal precursor vaporization system 2. Thus, the ruthenium carbonyl precursor 3 can contain un-reacted $Ru_3CO_{12}$ precursor and partially reacted $RU_3(CO)_x$ precursor (where x<12). Depending on the means of heating the ruthenium carbonyl precursor 3 (e.g., heater elements outside or inside the metal precursor vaporization system 2), the $Ru_3CO_{12}$ and $Ru_3(CO)_x$ can, for example, form a mixture in metal precursor vaporization system 2 or, alternately, regions can be found where $RU_3(CO)_x$ is preferentially formed. The inventors have observed that the $Ru_3(CO)_x$ can be preferentially formed on the hottest internal surfaces of the metal precursor vaporization system 2.

The presence of $Ru_3CO_{12}$ and $RU_3(CO)_x$ in metal precursor vaporization systems, such as those described Ser. Nos. 10/996,145 and 10/996,144, can reduce the precursor delivery to the process chamber 13 due to the significantly lower vapor pressure of $RU_3(CO)_x$ compared to that of $Ru_3CO_{12}$. The reduced precursor delivery can affect the deposition rate on a substrate in the process chamber 13, requiring raising of the vaporization temperature to increase the delivery rate, which can further accelerate the premature decomposition of $Ru_3CO_{12}$ to $Ru_3(CO)_x$.

Still referring to FIG. 1A, a gas supply system 4 is coupled to the metal precursor vaporization system 2, and it is configured to supply a carrier gas beneath the ruthenium carbonyl precursor 3 via feed line 4a, and/or over the ruthenium carbonyl precursor 3 via feed line 4b. The flow of the carrier gas can be controlled using a mass flow controller (MFC) coupled to the feed lines 4a and 4b between the gas supply system 4 and the metal precursor vaporization system 2. According to embodiments of the invention, the carrier gas includes a carbon-monoxide-containing (CO-containing) gas. In addition to CO, the carrier gas can optionally contain an inert gas such as $N_2$ or a noble gas, for example argon (Ar).

A precursor collection system 7 is in fluid communication with the metal precursor vaporization system 2 via a delivery line 6 for gas phase transfer of un-reacted $Ru_3CO_{12}$ precursor from the metal precursor vaporization system 2 to the precursor collection system 7. The delivery line 6 and the precursor collection system 7 are coupled to the vaporization temperature control system 5. Alternatively, multiple temperature control systems may be used to control the temperatures of the metal precursor vaporization systems 2, the precursor collection system 7, and the delivery line 6. A vacuum pumping system 8 is configured for evacuating the metal precursor vaporization system 2 and the precursor collection system 7 through the delivery line 6. The vacuum pumping system 8 can be configured for evacuating the metal precursor vaporization system 2 and the precursor collection system 7 to a pressure between about 0.1 mTorr and about 760 Torr, or to a pressure between about 10 mTorr and about 500 m Torr. Pressure monitoring systems 11, 12 are configured for monitoring the pressure in the metal precursor vaporization system 2 and the precursor vaporization system 7, respectively. Alternatively, more than one vacuum pumping system may be used to evacuate the metal precursor vaporization system 2 and the precursor collection system 7.

A control system 9 is configured to operate and control the operation of the refurbishing system 14. The control system 9 includes a microprocessor, a memory, and a digital I/O port capable of generating control voltages sufficient to communicate with and activate inputs of the refurbishing system 14 as well as monitor outputs from the refurbishing system 14. Moreover, the control system 9 is coupled to and exchanges information with the metal precursor vaporization system 2, the precursor collection system 7, the vaporization temperature control system 5, the delivery line 6, the pumping system 8, the gas supply system 4, and the pressure monitoring systems 11, 12. A program stored in the memory is utilized to control the aforementioned components of refurbishing system 14 according to a stored process recipe. The control system 9 may be implemented as a general-purpose computer, digital signal process, etc.

The control system 9 may be locally located relative to the refurbishing system 14 or it may be remotely located relative to the refurbishing system 14 via an internet or intranet. Thus, the control system 9 can exchange data with the refurbishing system 14 using at least one of a direct connection, an intranet, or the internet. The control system 9 may be coupled to an intranet at a customer site (i.e., a device maker, etc.), or coupled to an intranet at a vendor site (i.e., an equipment manufacturer). Furthermore, another computer (i.e., controller, server, etc.) can access the control system 9 to exchange data via at least one of a direct connection, an intranet, or the internet.

Metal precursor vaporization systems utilized for providing $Ru_3(CO)_{12}$ vapor have contemplated operating within a temperature range of approximately 40° C. to 45° C. for $Ru_3(CO)_{12}$ precursor under vacuum conditions in order to prevent decomposition, which occurs at higher temperatures. For example, $Ru_3(CO)_{12}$ can decompose at elevated temperatures to form by-products, such as those illustrated below:

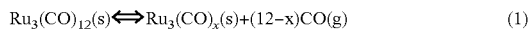
$$Ru_3(CO)_{12}(s) \Longleftrightarrow Ru_3(CO)_x(s) + (12-x)CO(g) \quad (1)$$

or,

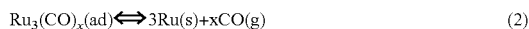
$$Ru_3(CO)_x(ad) \Longleftrightarrow 3Ru(s) + xCO(g) \quad (2)$$

thereby forming a mixture of $Ru_3(CO)_{12}$, $RU_3(CO)_x$, and possibly Ru in the metal precursor vaporization system. The low vapor pressure of $Ru_3(CO)_{12}$ and the small process window, can results in very low deposition rate of a Ru layer on the substrate. In the above-mentioned co-pending applications, the inventors realized that a CO-containing carrier gas can be used to reduce dissociation of the $Ru_3(CO)_{12}$ precursor, thereby allowing for heating the $Ru_3(CO)_{12}$ precursor to a high temperature (e.g., 80° C., or higher) which increases the vapor pressure of the $Ru_3(CO)_{12}$ precursor, without significant decomposition of the $Ru_3(CO)_{12}$ precursor vapor during the transport to a process chamber.

In the current invention, the current inventors have realized that a CO-containing gas can be utilized to effectively separate and transfer un-reacted $Ru_3(CO)_{12}$ from metal precursor vaporization system containing $Ru_3(CO)_{12}$ and $RU_3(CO)_x$. Further, the use of a CO-containing gas reduces dissociation of the $Ru_3(CO)_{12}$ precursor, thereby shifting the equilibrium in Equation (1) to the left and reducing premature decomposition of the $Ru_3(CO)_{12}$ precursor while allowing for heating the $Ru_3(CO)_{12}$ precursor to higher temperature than is possible without a CO-containing gas. It is believed that addition of the CO gas to the $Ru_3(CO)_{12}$ precursor vapor allows for increasing the vaporization temperature from approximately 40° C. to approximately 150° C., or higher. The elevated temperature increases the vapor pressure of the $Ru_3(CO)_{12}$ precursor, resulting in increased transfer of the $Ru_3(CO)_{12}$ from the metal precursor vaporization system 2 to the precursor collection system 7 via the gas line 6.

FIG. 1B shows the un-reacted $Ru_3(CO)_{12}$ precursor 3a separated and transferred from the partially reacted ruthenium carbonyl precursor 3b in the metal precursor vaporization system 2 and collected in the precursor collection system 7. According to an embodiment of the invention, the precursor collection system 7 can be maintained at a lower temperature than the metal precursor vaporization system 2 during the transfer process, in order to adsorb the un-reacted $Ru_3(CO)_{12}$ precursor 3a onto the interior surfaces of the precursor collection system 7. In one example, the metal precursor vaporization system 2 can be maintained at a temperature between about 50° C. and about 150° C., while the precursor collection system 7 can be maintained at a temperature lower than about 40° C.

According to an embodiment of the invention, the pumping system 8 can be utilized to evacuate the metal precursor vaporization system 2 and the precursor collection system 7 during the transfer process. Thus, the pumping system 8 can remove the CO-containing gas flowing from the precursor vaporization system 2 to the precursor collection system 7 during the transfer process. According to another embodiment of the invention, the pumping system 8 can be turned off during the transfer process. It will be clear to one skilled in the art that the refurbishing system 14 in FIGS. 1A and 1B can be configured with any number of valves, regulators and/or flow meters (not shown) for measuring and controlling a flow of the CO-containing gas.

According to an embodiment of the invention, the precursor vaporization system 2 and the collection systems 7 can be have large surface areas for accommodating large amounts of metal carbonyl precursor. Such precursor collection systems are, for example, described in co-pending U.S. patent application Ser. No. 10/998,420, entitled "MULTI-TRAY FILM PRECURSOR EVAPORATION SYSTEM AND THIN FILM DEPOSITION SYSTEM INCORPORATING THE SAME," the entire content of which is incorporated by reference.

After the un-reacted precursor 3a is separated and transferred to the precursor collection system 7, the partially reacted precursor 3b can then be removed from the metal precursor vaporization system 2. Ideally, the removed partially reacted precursor 3b would be recycled. The un-reacted precursor 3a residing in the precursor collection system 7 can now be re-used as fresh precursor 3 during processing in the process chamber 13, for example. In one embodiment, the un-reacted precursor 3a can be transferred back to metal precursor vaporization system 2, for example, via delivery line 6 or by some other transfer means, such as another delivery line (not shown), or by simply opening the precursor collection system 7 and the metal precursor vaporization system 2 and transferring (e.g., pouring) the un-reacted precursor 3a from the precursor collection system 7 to the metal precursor vaporization system 2.

In another embodiment, depicted in FIG. 1C, precursor collection system 7 can be used as a metal precursor vaporization system coupled to process chamber 13, and metal precursor vaporization system 2 can be used as a precursor collection system. Thus, in this embodiment, systems 2 and 7 are interchangeable (denoted by system 7,2 and system 2,7), each having a coupling to the process chamber 13, a gas source 4, feed lines 4a and/or 4b, and a vacuum pumping system 8. It may be appreciated that in this embodiment, processing in chamber 13 may be performed using system 7,2 as the metal precursor vaporization system until the precursor 3 in system 7,2 contains an undesired level of partially reacted precursor 3b, at which time processing is halted in order to refurbish the precursor 3. Refurbishing is then carried out to separate the un-reacted precursor 3a and transfer it to system 2,7, which is used as the precursor collection system. The function of systems 2,7 and 7,2 can then be switched so that processing in process chamber 13 can resume using the un-reacted precursor 3a in system 2,7, which now operates as the metal precursor vaporization system, while the partially reacted precursor 3b is removed from the other system 7,2. The down-time for the deposition system needed for refurbishment is thereby reduced because removal of the partially reacted precursor 3b for recycling can be carried out while resuming processing using the other interchangeable system. After processing is resumed in process chamber 13, it is again carried out until a precursor 3 is formed in system 2,7 (the metal precursor vaporization system) that contains un-reacted precursor 3a and an undesired level of precursor 3b. Refurbishing is performed again by separating and transferring the un-reacted precursor 3a to the now-cleaned system 7,2, which serves as the precursor collection system.

The temperature control system 5 is configured to change to relative temperatures of the systems 2,7 and 7,2, depending on which is being used as the metal precursor vaporization system 7. In one embodiment, temperature control system 5 is configured to heat system 7,2 to a temperature for vaporizing un-reacted precursor 3a and to maintain system 2,7 at a lower temperature for collecting the vapor of the un-reacted precursor 3a from system 7,2. When the systems are switched, temperature control system 5 is then re-configured to heat system 2,7 to a temperature for vaporizing un-reacted precursor 3a and to maintain system 7,2 at a lower temperature for collecting the vapor of the un-reacted precursor 3a from system 2,7. Control system 9 is configured to control the temperature control system 5 to enable the switching between systems and operating temperatures.

Figure 2:
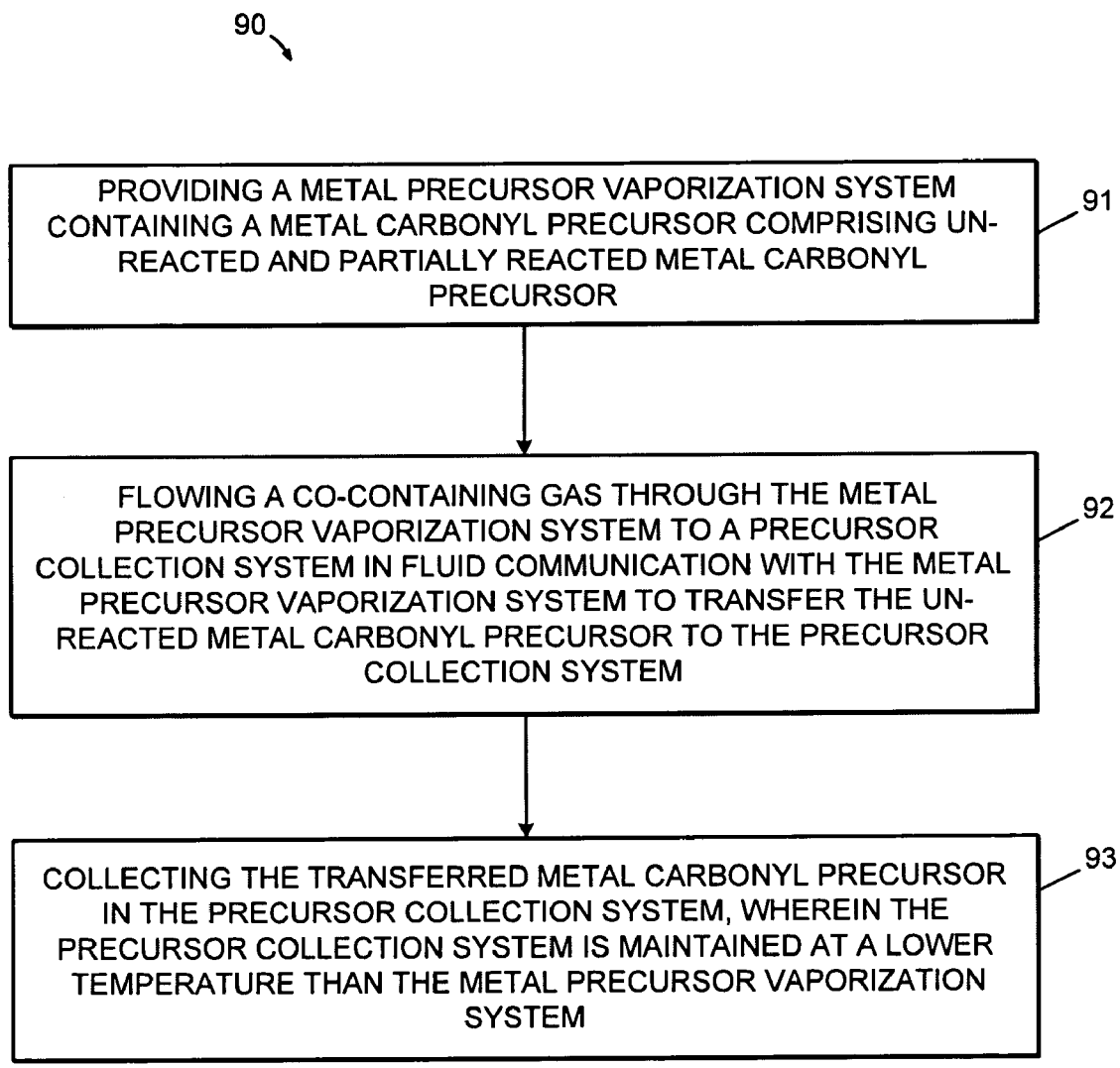
FIG. 2 is flowchart illustrating a method of refurbishing a metal carbonyl precursor according to an embodiment of the invention.

FIG. 2 is a flowchart illustrating a method of refurbishing a metal carbonyl precursor according to an embodiment of the invention. Referring also to FIGS. 1A-1C, the process 90 includes, in step 91, providing a metal precursor vaporization system 2 containing a metal carbonyl precursor 3 comprising un-reacted metal carbonyl precursor 3a and partially reacted metal carbonyl precursor 3b. According to embodiments of the invention, the metal carbonyl precursor 3 may contain a solid metal carbonyl precursor, a liquid metal-containing precursor, or a combination thereof. According to an embodiment of the invention, the step 91 can further include heating the metal precursor vaporization system 2 to a desired temperature to vaporize the un-reacted metal carbonyl precursor 3a in the metal precursor vaporization system 2.

In step 92, a CO-containing gas is flowed through the metal-precursor vaporization system 2 to the precursor collection system 7 to transfer the vapor of the un-reacted metal carbonyl precursor 3a to the precursor collection system 7. The CO-containing gas is supplied from a gas source 4 to flow through and/or over the metal carbonyl precursor 3. According to an embodiment of the invention, the CO-containing gas can further contain an inert gas, for example a noble gas such as He, Ne, Ar, Kr, or Xe. A flow of the CO-containing gas can, for example, be between about 0.1 sccm and about 1000 sccm.

In step 93, the transferred metal carbonyl precursor 3a is collected in the precursor collection system 7, where the precursor collection system 7 is maintained at a lower temperature than the metal precursor vaporization system 2. According to an embodiment of the invention, the metal carbonyl precursor can be a $Ru_3(CO)_{12}$ precursor and the temperature of the metal precursor vaporization system can be maintained at a temperature between about 50° C. and about 150° C.

As would be appreciated by those skilled in the art, each of the steps or stages in the flowchart of FIG. 2 may encompass one or more separate steps and/or operations. Accordingly, the recitation of only three steps in 91, 92, 93 should not be understood to limit the method of the present invention solely to three steps or stages. Moreover, each representative step or stage 91, 92, 93 should not be understood to be limited to only a single process. In one embodiment, for example, the method further includes, after transferring the un-reacted precursor 3a to precursor collection system 7, removing the partially reacted precursor 3b from the metal precursor vaporization system 2. An optional cleaning process may be performed, using solvents, for example, to ensure complete removal of all residue of partially reacted precursor 3b. Thereafter, the method may further include transferring the un-reacted precursor 3a back to the metal precursor vaporization system 2 to be used in subsequent processing as a fresh precursor.

Embodiments of the invention further include a method of monitoring status of a metal carbonyl precursor in a metal precursor vaporization system, where the status of the metal carbonyl precursor can be utilized to decide when to refurbish the metal carbonyl precursor.

Figure 3:
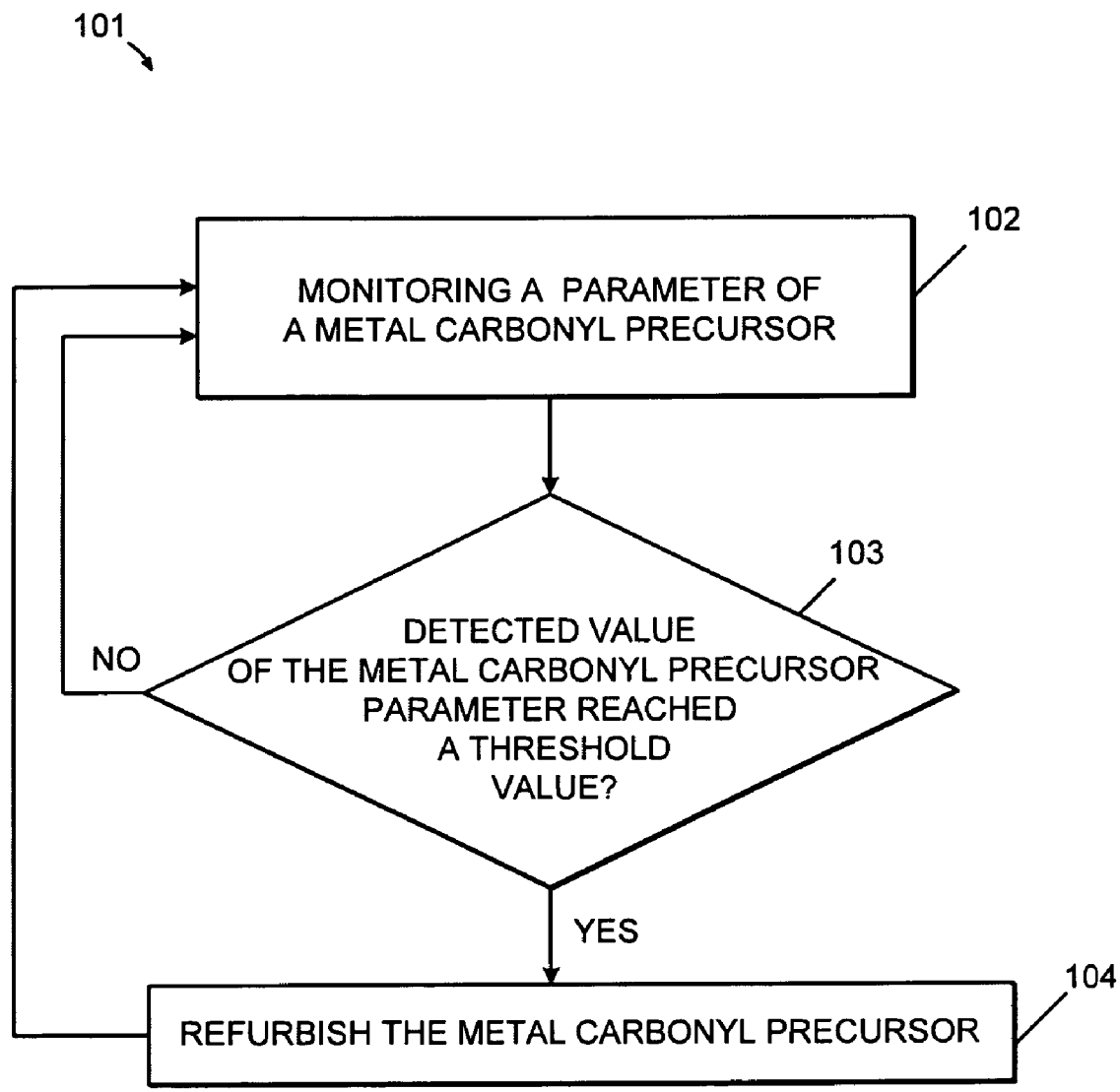
FIG. 3 is a flowchart showing a method of monitoring status of a metal carbonyl precursor according to an embodiment of the invention.

FIG. 3 is a flowchart showing a method of monitoring status of a metal carbonyl precursor according to an embodiment of the invention. The process 101 includes, in step 102, monitoring a parameter of a metal carbonyl precursor in a metal precursor vaporization system. In the case of a ruthenium carbonyl precursor, the parameter can, for example, include the ruthenium carbonyl vapor pressure. Referring back to FIG. 1A, vapor pressure measurements can be performed using the pressure monitoring system 11. Vapor pressure measurements as a function of the vaporization temperature and/or as a function of the total amount of precursor in the metal precursor vaporization system 2, where the total amount of precursor can be determined from the total weight of the metal precursor vaporization system, can be used to calculate the relative amounts of $Ru_3(CO)_x$ and $Ru_3(CO)_{12}$ in the ruthenium carbonyl precursor 3. In another example, the parameter can include the color of the ruthenium carbonyl precursor, where the color can, for example, be measured by visual inspection. The color of the ruthenium carbonyl precursor can be used to calculate the relative amounts of $RU_3(CO)_x$ and $Ru_3(CO)_{12}$ in the ruthenium carbonyl precursor 3 by comparing the monitored color to the known colors of $Ru_3(CO)_{12}$ (orange) and $RU_3(CO)_x$ (dark or silver). In yet another example, the parameter can include the deposition rate of a Ru or Ru-containing layer on a substrate in a CVD process utilizing the ruthenium carbonyl precursor 3. The deposition rate can be determined by measuring the thickness of the layer following the CVD process.

In step 103, if the detected value of the metal carbonyl parameter (e.g., vapor pressure, precursor color, or deposition rate) has not reached a threshold value, the monitoring is continued in step 102. If a threshold value has been reached in step 103, indicating that the metal carbonyl precursor may need to be refurbished, a decision is made in step 103 whether to continue the monitoring in step 102, or to stop the monitoring and refurbish the metal carbonyl precursor in step 104. The refurbishing can subsequently be carried out using the method described in FIGS. 1A-1B and FIG. 2.

The determining in step 103 whether the monitoring should be continued in step 102 or stopped in step 104 can depend on the deposition process to be performed in the process chamber. Correlation of the detected value of the metal carbonyl precursor parameter to deposition conditions can, for example, be carried out by a test process that is performed while monitoring the deposition conditions. The detected value of the metal carbonyl precursor parameter can, for example, be evaluated by inspecting the deposited layer (e.g., layer thickness) and correlating the inspected results to a detected threshold intensity recorded when a desired deposition condition is observed. The threshold intensity may, for example, be a fixed parameter value (e.g., vapor pressure, precursor color, or deposition rate), or a mathematical operation applied to at least two parameters to create an adjusted parameter.

Figure 4:
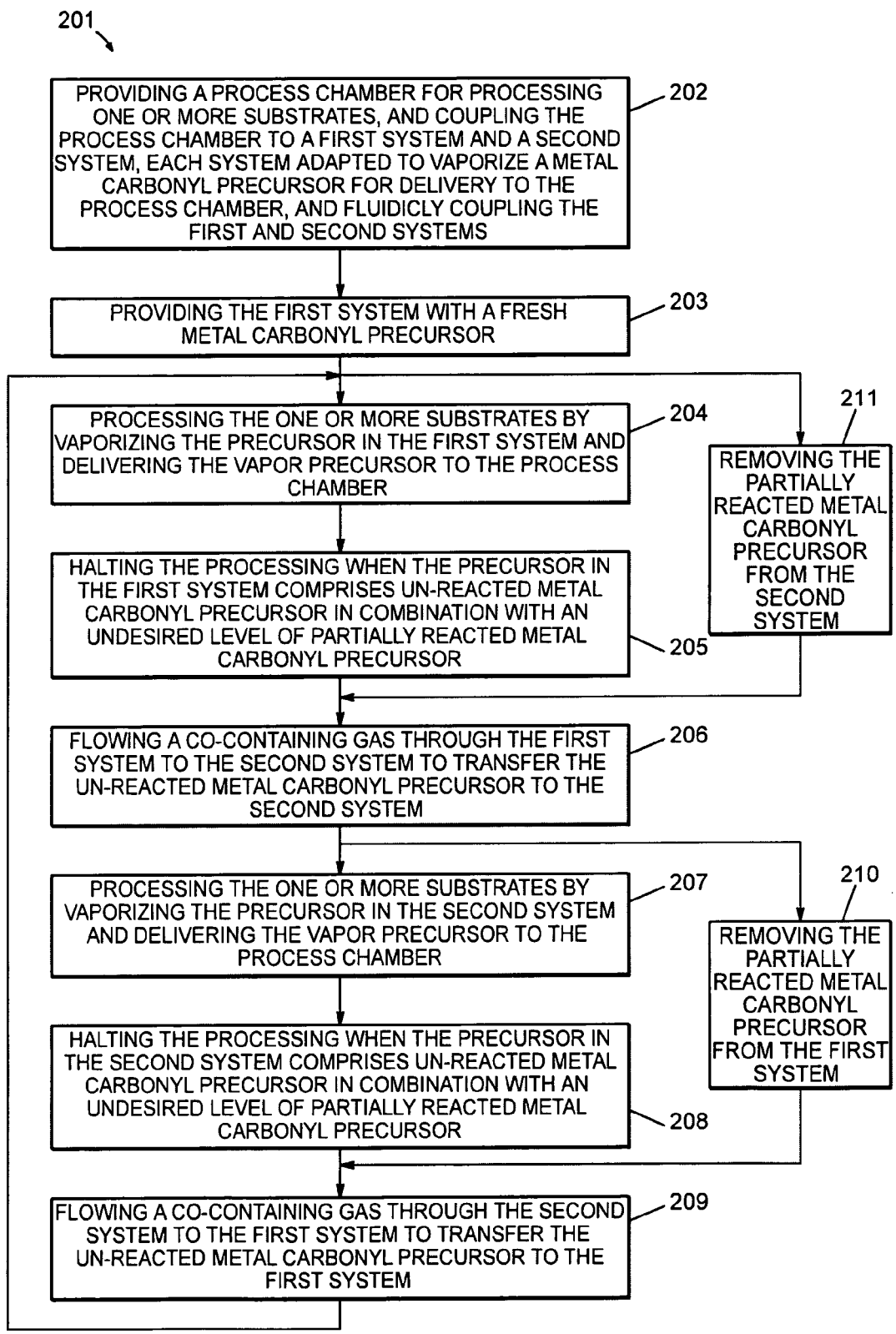
FIG. 4 is a flowchart illustrating a method of processing a substrate using a metal carbonyl precursor, including refurbishing the metal carbonyl precursor, according to an embodiment of the invention.

FIG. 4 provides a flowchart depicting a processing method 201 for processing a substrate with a metal carbonyl precursor that includes periodic refurbishing of the precursor in accordance with an embodiment of the present invention. The method may be used, for example, in conjunction with the system 14 depicted in FIG. 1C. In step 202, the method includes providing a process chamber for processing one or more substrates, coupling the process chamber to a first system (e.g., system 2,7) and a second system (e.g., system 7,2), and fluidicly coupling the first and second systems.

Each system is adapted to evaporate a metal carbonyl precursor for delivery to the process chamber.

In step 203, the method includes providing the first system with a fresh metal carbonyl precursor. In step 204, processing is carried out on the one or more substrates by evaporating the precursor in the first system and delivering the vapor precursor to the process chamber. In step 205, the processing is halted when the precursor in the first system comprises un-reacted metal carbonyl precursor in combination with an undesired level of partially reacted metal carbonyl precursor. The monitoring process 101, depicted in FIG. 3, can be used to determine when the undesired level is reached.

In step 206, the refurbishing process is carried out by flowing a CO-containing gas through the first system to the second system to transfer the un-reacted metal carbonyl precursor to the second system. The partially reacted precursor remains in the first system. The un-reacted precursor in the second system may now be used a fresh precursor, alone or in combination with additional fresh precursor added to the second system.

In step 207, processing is again carried out on the one or more substrates, but in this step, by evaporating the fresh precursor in the second system and delivering the vapor precursor to the process chamber. While processing is being carried out in step 207, the method further includes, in step 210, removing the partially reacted metal carbonyl precursor from the first system. Optionally, a cleaning process may be used, such a wet solvent process, to remove all residue of partially reacted precursor.

In step 208, the processing of substrates is again halted when the precursor in the second system comprises un-reacted metal carbonyl precursor in combination with an undesired level of partially reacted metal carbonyl precursor. In step 209, the refurbishing process is again carried out by flowing a CO-containing gas through the second system to the first system to transfer the un-reacted metal carbonyl precursor to the first system, which is free of partially reacted metal carbonyl precursor by virtue of step 210.

The process may be repeated as many times as desired, by repeating steps 204-211. In this regard, while processing is carried out in step 204, the method includes, in step 211, removing the partially reacted metal carbonyl precursor from the second system, and optionally, cleaning the second system. Thus, after refurbishing the precursor by separating the un-reacted precursor from the partially reacted precursor, the processing in steps 204 and 207 can be resumed with shorter down-times in between as a result of the dual systems for evaporating the metal carbonyl precursor and the steps 211 and 210, respectively, being carried out concurrently with the processing of substrates.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of refurbishing a metal carbonyl precursor in a metal precursor vaporization system where the metal carbonyl precursor comprises un-reacted and partially reacted metal carbonyl precursor, the method comprising:

flowing a CO-containing gas through the metal precursor vaporization system to a precursor collection system in fluid communication with the metal precursor vaporization system to separate the un-reacted metal carbonyl precursor from the partially reacted metal carbonyl precursor and to transfer the un-reacted metal carbonyl precursor to the precursor collection system; and collecting the transferred metal carbonyl precursor in the precursor collection system, wherein the precursor collection system is maintained at a lower temperature than the metal precursor vaporization system.

2. The method according to claim 1, wherein the un-reacted metal carbonyl precursor, the partially reacted metal carbonyl precursor, or both, comprise a solid, a liquid, or a combination thereof.

3. The method according to claim 1, further comprising:
heating the metal carbonyl precursor; and
vaporizing the un-reacted metal carbonyl precursor to form precursor vapor in the metal precursor vaporization system, wherein the precursor vapor is transferred by the CO-containing gas to the precursor collection system.

4. The method according to claim 3, wherein the heating comprises heating the metal carbonyl precursor to a temperature between about 50° C. and about 150° C.

5. The method according to claim 1, wherein the CO-containing gas further comprises an inert gas.

6. The method according to claim 5, wherein the inert gas comprises $N_2$, a noble gas, or a combination thereof.

7. The method according to claim 1, wherein a flow of the CO-containing gas is between about 0.1 sccm and about 1000 sccm.

8. The method according to claim 1, further comprising:
removing the partially reacted metal carbonyl precursor from the metal precursor vaporization system.

9. The method according to claim 1, further comprising:
evacuating the metal precursor vaporization system and the precursor collection system during the flowing and collecting.

10. The method according to claim 1, wherein the metal carbonyl precursor comprises a tungsten carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof.

11. The method according to claim 1, wherein the metal carbonyl precursor comprises $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

* * * * *